United States Patent [19]

Kashiwagi et al.

[11] 4,400,439

[45] Aug. 23, 1983

[54] RECORDING MEDIA

[75] Inventors: Takashi Kashiwagi, Tanashi; Nobuyuki Inoue, Tokyo, both of Japan

[73] Assignee: Process Shizai Co., Ltd., Tokyo, Japan

[21] Appl. No.: 232,491

[22] Filed: Feb. 9, 1981

[30] Foreign Application Priority Data

Feb. 7, 1980 [JP] Japan .............................. 55/13017
Dec. 9, 1980 [JP] Japan ............................. 55/172643

[51] Int. Cl.$^3$ .......................... B32B 3/10; G03C 5/00
[52] U.S. Cl. ............................. 428/478.2; 428/478.8; 428/913; 428/207; 428/412; 428/480; 428/435; 428/459; 428/523; 428/532; 430/964; 430/5
[58] Field of Search ................. 428/478.2, 478.8, 913; 430/964, 5

[56] References Cited

U.S. PATENT DOCUMENTS

| | | | |
|---|---|---|---|
| 2,668,766 | 2/1954 | Beckel et al. | 428/482 |
| 4,115,613 | 9/1978 | Inoue et al. | 428/323 X |
| 4,234,212 | 11/1980 | Kato et al. | 428/913 |
| 4,278,749 | 7/1981 | Wright | 428/478.8 X |
| 4,288,509 | 9/1981 | Kashiwagi | 428/913 |

*Primary Examiner*—P. C. Ives
*Attorney, Agent, or Firm*—Sughrue, Mion, Zinn, Macpeak & Seas

[57] ABSTRACT

A recording medium is described comprising a recording layer having provided on a support, wherein the recording layer contains at least one chemically modified thermally coagulatable proteinaceous compound containing therein no intermolecular cross-linking bond.

11 Claims, No Drawings

4,400,439

RECORDING MEDIA

BACKGROUND OF THE INVENTION

This invention relates to a recording medium in which a chemically modified proteinaceous compound containing therein no intermolecular cross-linking bond is used as a recording component.

With regard to light-sensitive media using a protein and its derivatives, J. Kosar, *Light-Sensitive Systems*, page 62, John Wiley & Sons, Inc. (1965) describes that albumin is made insoluble on application of ultraviolet rays in the presence of dichromates and this phenomenon can be utilized in an egg white photographic printing plate, and *Journal of Applied Polymer Science*, 7, page 273 (1963) describes that a mixed system of 3-azidophthalated gelatin and a naphthothiazoline based sensitizer is made insoluble on irradiation with light.

Furthermore, with regard to recording media using thermally coagulatable proteinaceous compounds in which a recording layer is selectively changed by application of a heat pattern to form a latent image, and unchanged areas of the recording layer are then removed to form a recording image, U.S. Pat. No. 4,115,613 (corresponding to British Pat. No. 1,572,073) and Japanese Patent Application (OPI) No. 15817/80 (the term "OPI" as used herein refers to a "published unexamined Japanese patent application") disclose a heat-sensitive recording layer containing therein a high molecular weight proteinaceous compound.

Recording using these recording media is performed by irradiation with xenon flash light, laser light, and so on. If the recording could be performed by irradiation with low energy light, it would be possible to use a light source which is of low output, inexpensive, and has a long service life. This could lead to miniaturization and cost reduction of the light source apparatus. It has therefore been desired to develop a recording medium which is capable of providing a sharp and stable recording image by irradiation with low energy light.

SUMMARY OF THE INVENTION

According to this invention, it has been found that with a recording layer in which a chemically modified thermally coagulatable proteinaceous compound containing therein no intermolecular cross-linking bond is used as a recording component, insolubilization occurs on application of energy, e.g., light and heat, which is lower than that required for recording media in which conventional proteinaceous compounds are used.

Furthermore, it has been found that with a recording layer prepared using a chemically modified thermally coagulatable proteinaceous compound containing therein no intermolecular cross-linking bond, the adhesion of the recording layer to a support is significantly high because the film-forming properties of the proteinaceous compound are good, and therefore the burning out of the recording layer by high irradiation energy is greatly reduced and the latitude in applying energy can be extended.

Furthermore, it has been found that a chemically modified thermally coagulatable proteinaceous compound as used as a recording component in this invention has the advantage that it can be preserved for longer times than known thermally coagulatable proteinaceous compounds, such as albumin.

This invention, therefore, provides a recording medium comprising a recording layer having provided on a support, wherein the recording layer contains at least one chemically modified thermally coagulatable proteinaceous compound containing therein no intermolecular cross-linking bond.

DETAILED DESCRIPTION OF THE INVENTION

Upon chemical modification of proteinaceous compounds by the use of a reagent containing two reactive functional groups in the molecule thereof, in general, two kinds of cross-linkings, i.e., intermolecular cross-linking or intramolecular cross-linking, occur. Of these intermolecularly or intramolecularly cross-linked proteinaceous compounds, the former intermolecularly cross-linked proteinaceous compound is greatly reduced in the solubility thereof in a solvent, such as water, and in accordance with this invention, therefore, a chemically modified thermally coagulatable proteinaceous compound containing therein no intermolecular cross-linking bond is used in a recording layer as a recording component.

Methods for chemical modification of proteinaceous compounds are described in G. E. Means and R. E. Feeney, *Chemical Modification of Protein*, Holden-Day Inc. (1971) and T. S. Work and E. Work, *Laboratory Techniques in Biochemistry and Molecular Biology*, North-Holland Publishing Co. (1975).

The chemically modified thermally coagulatable proteinaceous compound containing therein no intermolecular cross-linking bond which is used as a recording component in this invention can be synthesized by the foregoing methods. According to these methods, chemical modifiers, such as acylation agents, cyanates, isocyanates, amidinization agents, guanidinization agents, sulfonyl halides, sulfonates, alkylation agents, esterification agents, amidation agents, reducing agents, oxidizing agents, electronphilic reagents, dicarbonyl compounds, sulphenyl halides, nitrous acid, cyanogen bromide, acids, alkalis, polypeptization agents, and graft agents (e.g., polymeriable monomers), which are capable of selectively reacting with various groups and bonds in the molecule of a thermally coagulatable proteinaceous compound, such as an amino group, a phenol group, a mercapto group, an imidazolyl group, a carboxyl group, a methylthio group, a guanidine group, a tryptophane residue, a histidine residue, an asparagine residue, a methionine residue, a tyrosine residue, a cystine residue, and a disulfide bond, and compounds containing therein functional groups capable of reacting with and being chemically linked to the proteinaceous compound, and light-sensitive groups, such as an azido group, a sulfonylazido group, a cinnamoyl group, a cinnamylidene group, a 4-stilbazole group, and an ethylenically unsaturated group, are used to obtain a chemically modified thermally coagulatable proteinaceous compound containing therein no intermolecular cross-linking bond.

Thermally coagulatable proteinaceous compounds which can be used to synthesize the chemically modified thermally coagulatable proteinaceous compound of this invention include isolated proteins, such as albumin, hemoglobin, globulin, prolamins, and glutelin; egg white and dry egg white containing albumin as a major ingredient; blood powder containing hemoglobin as a major ingredient; soybean protein containing globulin as a major ingredient, such as dry soybean milk and concentrated soybean protein powder; wheat gluten containing prolamins and glutelin as major ingredients, such as active wheat protein; and corn protein containing prolamin as a major ingredient, such as sein.

In producing the recording medium of this invention, at least one chemically modified thermally coagulatable proteinaceous compound containing therein no intermolecular cross-linking bond is dissolved or emulsified and dispersed in a solvent, such as water, coated on a support, and dried to form a recording layer, or a suitable amount of the chemically modified thermally coagulatable proteinaceous compound containing therein no intermolecular cross-linking bond is mixed with a high molecular weight compound as described in U.S. Pat. No. 4,115,613 and Japanese Patent Application (OPI) No. 15817/80, and the resulting mixture is coated on a support to form a recording layer.

In the latter method, the amount of the chemically modified thermally coagulatable proteinaceous compound being added to the foregoing high molecular weight compound is at least about 2% by weight, preferably at least 10% by weight, but up to about 98% by weight, based on the weight of the recording layer.

The recording layer of this invention can contain known light-sensitizers which are used in the art of photopolymers, or one or more heat-sensitizers as described in U.S. Pat. No. 4,115,613. Furthermore, fine particles of substances capable of absorbing light and converting to heat, such as carbon black and graphite, as described in U.S. Pat. No. 4,115,613, or coloring materials, such as yellow, orange and red dye-pigments as described in U.S. Pat. No. 4,288,509, filed July 20, 1979 (corresponding to EPC Patent Publication No. 0007784), can be incorporated thereinto.

Supports which can be used in providing the recording layer thereon include a plastic (e.g., polyesters, cellulose triacetates, polystyrene and polycarbonates) film, a matted film, such as a polyester film whose surface is matted, a synthetic paper, glass, and a metal (e.g., aluminum, and copper) sheet. A subbing layer may be provided on the support for the purpose of the modification thereof.

Recording using the recording medium of this invention is performed by application of either light or heat. In recording by application of light, light having wavelength which is absorbed by the thermally coagulatable proteinaceous compound with a light-sensitive group introduced thereinto, or the light-sensitizer added, is irradiated. Light sources which can be used for such irradiation include a carbon arc lamp, a xenon arc lamp, a high pressure mercury lamp, a fluorescent lamp, a metal halide lamp, an argon ion laser, a xenon flash lamp, and a photographic flood lamp.

Methods of recording by application of heat can be grouped into an external heating method and an internal heating method. In accordance with the external heating method, selective heat-insolubilization is achieved by bringing the recording layer into direct contact with heat or a heat pattern, or by receiving heat generated and accumulated by light-exposure in heat-absorbing areas of an original in accordance with a reflective light-exposure method, selective heat insolubilization is achieved. The internal heating method is mainly applied to a recording layer containing therein a light-heat conversion substance as described in U.S. Pat. No. 4,115,613. In accordance with this internal heating method, electromagnetic radiation rays are selectively applied onto the recording layer by exposing it to light through a mask, and the recording layer is insolubilized by the heat generated by the light-heat conversion substance.

In forming a recording image on the recording layer on which heat and/or light has been applied as described above, either areas of the recording layer which have been changed by heat and/or light, i.e., changed areas, or unchanged areas are removed. Usually, on removing unchanged areas of the recording layer by applying thereon a solvent capable of dissolving the chemically modified thermally coagulatable proteinaceous compound containing therein no intermolecular cross-linking bond, such as water, a diluted aqueous solution of an acid, a diluted aqueous solution of an alkali, an aqueous solution of a neutral salt, an aqueous solution containing urea, $\gamma$-butyrolactone, and $\gamma$-valerolactone, at room temperature by a method, such as shower development, spray development, dip development, and wipe development, changed areas, e.g., insolubilized areas corresponding to a heat and/or light pattern, are obtained as recorded images.

The following Preparation Examples and Examples are given to illustrate this invention in greater detail.

PREPARATION EXAMPLE 1

Oxidation of Albumin by N-Bromosuccinimide

An aqueous solution (pH 5.7) prepared by adding 85 g of a 0.1 M acetic acid buffer solution (pH 4.4) to 100 g of a 25% aqueous solution of albumin was cooled to 10° C. To the aqueous solution thus obtained was added an aqueous solution prepared by dissolving 0.75 g of N-bromosuccinimide in 50 g of a 0.1 M acetic acid buffer solution (pH 4.4). On stirring the resulting solution at 10° C. for 30 minutes, it became turbid. The thus-obtained turbid solution was dialyzed with water to obtain 375 g of an emulsion. The solid content of the emulsion was 5.8%.

PREPARATION EXAMPLE 2

Guanidinization of Albumin by S-Methylisothiourea Sulfate

To 122 g of a 25% aqueous solution of albumin was added a 0.1 M aqueous solution of sodium hydroxide to adjust its pH to 10. A solution prepared by dissolving 42 g of an S-methylisothiourea sulfate in 440 g of water was added to the above-prepared solution while stirring at room temperature. During this period, the pH of the above solution was adjusted to 10 by adding a 2.5 M aqueous solution of sodium hydroxide. Subsequently, the solution was stirred at room temperature for 72 hours and dialyzed with water for 48 hours to obtain 910 g of a cloudy solution. The solid content of the cloudy solution was 3.6%.

PREPARATION EXAMPLE 3

Acylation of Albumin by Octanoyl Chloride

To 100 g of a 25% aqueous solution of albumin was added 150 g of a 3.8% aqueous solution of sodium bicarbonate, and furthermore a 10% aqueous solution of sodium hydroxide was added thereto to adjust the pH to 9. The resulting mixture was then cooled to 0° C. A solution of 10 g of octanoyl chloride in 20 g of acetone was added to the above-prepared solution, and the resulting solution was then stirred at 0° C. for 3 hours. During this stirring, a 10% aqueous solution of sodium hydroxide was added to adjust the pH to 9. After the stirring was completed, the reaction solution was dialyzed with water to obtain 570 g of a cloudy solution. The solid content of the cloudy solution was 4.5%.

PREPARATION EXAMPLE 4

Chemical Modification of Albumin by Phenyl Isocyanate

To 100 g of a 25% aqueous solution of albumin was added 100 g of a 7.5% aqueous solution of sodium bicarbonate, and furthermore a 10% aqueous solution of sodium hydroxide was added thereto to adjust the pH to 8.5. To the aqueous solution thus obtained was added 5 g of a phenyl isocyanate, and the resulting mixture was stirred at 40° C. for 1 hour. After the stirring was completed, the reaction solution was dialyzed with water and insoluble materials were filtered off to obtain 350 g of a transparent aqueous solution. The solid content of the transparent aqueous solution was 4.9%.

PREPARATION EXAMPLE 5

Chemical Modification of Albumin by 2,4-Dinitrofluorobenzene

To an aqueous solution prepared from 50 g of a 25% aqueous solution of albumin and 150 g of water was added a small amount of a 2% aqueous solution of sodium hydroxide to adjust the pH to 8.0. The thus-obtained aqueous solution was controlled to 15° C., and a solution consisting of 3.8 g of 2,4-dinitrofluorobenzene and 6.2 g of acetone was added thereto with stirring. The resulting solution was stirred at 15° C. for 5 hours and at the end of the time, the solution was dialyzed with flowing water to obtain 298 g of a transparent yellow solution. The solid content of the solution was 3.6%.

PREPARATION EXAMPLE 6

Alkylation of Albumin by N-Ethylmaleimide

To 80 g of a 25% aqueous solution of albumin were added 200 g of water and then 1 g of N-ethylmaleimide, and the resulting mixture was stirred at 25° C. for 1.5 hours. At the end of the time, the reaction solution was dialyzed with water to obtain 480 g of a transparent aqueous solution. The solid content of the aqueous solution was 3.7%.

PREPARATION EXAMPLE 7

Bromination of Albumin by Bromine (Electronphilic Reagent)

To 100 g of a 25% aqueous solution of albumin was added 100 g of a 0.1 M boric acid buffer solution (pH 9.5), and the resulting mixture was cooled to 0° C. To the mixture was added 35 ml of a cooled aqueous solution containing 0.24 M of potassium bromide and 0.05 M of bromine, and the resulting mixed solution was allowed to stand for 20 minutes. Thereafter, several drops of a 10% aqueous solution of acidic sodium sulfite were added thereto and dialyzed with water to obtain a transparent aqueous solution. The solid content of the aqueous solution was 5.7%.

PREPARATION EXAMPLE 8

Reduction of Albumin by Sodium Sulfite

To 130 g of an aqueous solution containing 25 g of albumin was added 0.5 M ammonia water to adjust the pH to 9.0. An aqueous solution consisting of 4 g of copper sulfate, 36 g of water and 68 g of 0.5 M ammonia water (pH 9.0) was added to the above-prepared aqueous solution, and the resulting solution was allowed to stand at room temperature for 2 hours and dialyzed with water at 4° C. by the use of 0.1 M sodium citrate. When all copper (III) ions were removed, the solution was dialyzed with water for the purpose of removing other electrolytes to thereby obtain 623 g of an aqueous solution. The solid content of the aqueous solution was 3.3%.

PREPARATION EXAMPLE 9

Chemical Modification of Guanidine Group in Albumin by 2,3-Butanedione

To a mixture of 100 g of 25% albumin and 150 g of a 0.2 M boric acid buffer solution (pH 7.6) was added 150 g of a 0.2 M boric acid buffer solution (pH 7.6) containing 25 g of 2,3-butanedione over a period of 5 minutes, and the resulting mixture was stirred at room temperature for 1 hour. After dialysis with water, insoluble materials were filtered off to obtain 457 g of a yellow solution. The solid content of the yellow solution was 3.9%.

PREPARATION EXAMPLE 10

Polypeptidization of Albumin by N-Carboxy-L-phenylalanine Anhydride

To 400 g of a 2.5% aqueous solution of albumin which had been cooled down to 0° C. was dropwise added a solution consisting of 15 g of N-carboxy-L-phenylalanine anhydride and 15 g of dioxane with stirring over a period of 20 minutes. After stirring at 0° C. for 1 hour, the solution was heated to room temperature and then stirred for additional 2 hours at that temperature. Thereafter, the resulting solution was dialyzed with water for 2 days, and insoluble materials were removed to obtain 439 g of a cloudy solution. The thus-obtained cloudy solution was concentrated by the use of an ultrafiltration device so that the solid content be 4.0%.

PREPARATION EXAMPLE 11

Oxidation of Albumin by N-Chlorosuccinimide

To 200 g of a 25% aqueous solution of albumin was added 200 g of a tris buffer solution (pH 8.5), and a solution of 5 g of N-chlorosuccinimide in 355 g of water was added thereto at room temperature. On stirring the resulting solution for 2 hours, an emulsion was obtained. After dialysis with water, water-insoluble materials were filtered off to obtain 800 g of an emulsion. The solid content and pH of the emulsion were 4.7% and 5.5, respectively.

PREPARATION EXAMPLE 12

Introduction of Azido Group by 1,4-Azidobenzoyl Chloride for Albumin

To a solution of 10 g of egg albumin powder (produced by Wako Pure Chemical Industry Co., Ltd.) in 160 g of water was added a 7.5% aqueous solution of sodium bicarbonate to adjust the pH to 8.0. The resulting solution was cooled down to 0° C., and 5 g of 4-azidobenzoyl chloride was added thereto with stirring over a period of 15 minutes. The thus-obtained solution was stirred at 10° C. for 3 hours. During this stirring, a 5% aqueous solution of sodium hydroxide was added to adjust the pH of the reaction solution to 8. After the reaction was completed, the reaction solution was dialyzed with flowing water for 3 days and then freeze-dried to obtain a light brown powdery solid material. Infrared absorption spectral analysis of the solid material showed that it had an absorption band at 2,110 cm$^{-1}$ (corresponding to the azido group), and that when xenon flash irradiation was applied, the intensity of absorption lowered.

PREPARATION EXAMPLE 13

Introduction of Azido Group by 4-Azidobenzene Isocyanate for Albumin

To a solution of 10 g of egg albumin in 90 g of water was added a 10% aqueous solution of sodium carbonate to adjust the pH to 8.5. The resulting solution was heated to 40° C., and 5 g of 4-azidobenzene isocyanate was added thereto with stirring at that temperature over a period of 10 minutes. The solution was stirred at 40° C. for additional 1 hour to complete the reaction. At the end of the time, the reaction solution was dialyzed with water and freeze-dried to obtain a solid material.

PREPARATION EXAMPLE 14

Introduction of Azido Group by [β-(4-Azidobenzoyl)oxypropyl]methacrylate for Albumin In 190 g of water was dissolved 10 g of egg albumin powder, and 10 g of [β-(4-azidobenzoyl)oxypropyl]methacrylate was added thereto. After nitrogen gas was flown for 40 minutes while maintaining the solution at 30° C., 2 g of 6% nitric acid and 10 g of a 1% aqueous solution of cerium (IV) ammonium nitrate was added thereto. Then, graft copolymerization was performed at 30° C. for 40 minutes while flowing nitrogen gas. After the reaction was completed, the reaction solution was dialyzed with flowing water for 3 days and then freeze-dried to obtain a solid material. Infrared absorption spectral analysis of the solid material showed that it had an absorption band at 2,110 cm$^{-1}$ (corresponding to the azido group).

PREPARATION EXAMPLE 15

Introduction of Sulfonylazido Group by 4-Azidosulfonylbenzene Diazonium Salt for Albumin An aqueous solution consisting of 5 g of 4-azidosulfonylaniline, 40 g of water, and 8 g of sulfuric acid was cooled down to 0° C., and 24 g of a 10% aqueous solution of sodium sulfite was added thereto with stirring to prepare an aqueous solution of a 4-azidosulfonylbenzene diazonium salt.

Separately, 10 g of egg albumin powder was dissolved in 90 g of water, and the resulting solution was adjusted to pH 8 by adding a 10% aqueous solution of sodium carbonate.

To the thus-obtained solution which had been controlled to 0° C. was added the above-obtained aqueous solution of 4-azidosulfonylbenzene diazonium salt with stirring over a period of 30 minutes. The pH of the solution thus-obtained was adjusted to 9 by adding a 10% aqueous solution of sodium hydroxide, and then, on stirring the resulting solution at 5° C. for 1 hour, a red reaction solution was obtained. Then, the reaction solution was dialyzed with flowing water and freeze-dried to obtain a solid material. Infrared absorption spectral analysis of the solid material showed that it had an absorption band at 2,120 cm$^{-1}$ (corresponding to the sulfonylazido group), and that when xenon flash irradiation was applied on the solid material, the intensity of absorption lowered.

PREPARATION EXAMPLE 16

Introduction of Sulfonylazido Group by 3-Azidosulfonyl Phthalic Anhydride for Albumin In 190 g of water was dissolved 10 g of egg albumin, and the pH of the resulting solution was adjusted to 9.5 by adding a 10% aqueous solution of sodium hydroxide. To the thus-obtained solution was added 4 g of 3-azidosulfonyl phthalic anhydride at 25° C. with stirring over a period of 1 hour. Then, a 10% aqueous solution of sodium hydroxide was added to adjust the pH to 9, and the resulting solution was further stirred at 25° C. for 2 hours. During this stirring, since the pH gradually lowered, a 10% aqueous solution of sodium hydroxide was added to maintain the pH at 9. After the reaction was completed, the reaction solution was dialyzed with flowing water for 3 days to obtain a transparent aqueous solution. Then, on freeze-drying the transparent aqueous solution, a solid material was obtained.

PREPARATION EXAMPLE 17

Introduction of Cinnamoyl Group by Cinnamoyl Chloride for Albumin

In 160 g of water was dissolved 10 g of egg albumin, and the pH of the resulting solution was adjusted to 8.0 by adding a 10% aqueous solution of sodium carbonate. The thus-obtained solution was cooled down to 5° C., and 5 g of cinnamoyl chloride was then added thereto with stirring. Then, a 10% aqueous solution of sodium hydroxide was added thereto to adjust the pH to 9.0, and the resulting solution was stirred at 25° C. for 3 hours. During this stirring, since the pH of the solution lowered, a 10% aqueous solution of sodium hydroxide was added to maintain the pH at 9.0. After the reaction, the reaction solution was dialyzed with water and freeze-dried to obtain a solid material.

PREPARATION EXAMPLE 18

Introduction of Methacryloyl Group by Glycidyl Methacrylate for Albumin

In 90 g of water was dissolved 10 g of egg albumin, and the pH of the resulting solution was adjusted to 4.0 by adding 100 g of a 20% aqueous solution of acetic acid. The thus-obtained solution was stirred at room temperature, and 5 g of glycidyl methacrylate was then added thereto. One hour after the addition of glycidyl methacrylate, the viscosity of the solution gradually increased. On dialyzing the solution with flowing water after allowing it to stand at room temperature for 3 days, a somewhat viscous emulsion was obtained. Then, the viscous emulsion was freeze-dried to obtain a solid material.

PREPARATION EXAMPLE 19

Introduction of Azido Group by 4-Azidobenzoyl Chloride for Globulin

A mixture of 10 g of globulin and 160 g of water was subjected to an ultrasonic wave treatment to disperse the globulin in water. The pH of the dispersion thus-obtained was adjusted to 8.0 by adding a 7.5% aqueous solution of sodium bicarbonate. The dispersion was cooled to 0° C., and 5 g of 4-azidobenzoyl chloride was added thereto with stirring. Then, the resulting mixture was stirred at 10° C. for 3 days. During this time, a 5% aqueous solution of sodium hydroxide was added to adjust the pH of the reaction solution to 8. After the reaction was completed, the reaction solution was dialyzed with flowing water and then freeze-dried to obtain a powdery solid material.

Using chemically modified albumins with a light-sensitive group introduced thereinto which were obtained in Preparation Examples 12, 15, 17 and 18, and albumin subjected to no chemical modification, a series of recording layers having the formulations as shown in Table 1 (in which no carbon black was added) were prepared. These recording layers were imagewise exposed by the use of a light source used in the conventional photographic image-forming method, such as a xenon arc lamp, a high pressure mercury lamp, or a metal halide lamp, and then were developed with water. With the recording layers prepared using the chemically modified albumins, insolubilization of light-irradiated areas occurred, forming an image. On the other hand, with the recording layer prepared using albumin which was subjected to no chemical modification, insolubilization did not occur and no image was obtained.

TABLE 1

| | Run No. | | | | |
|---|---|---|---|---|---|
| | 1 | 2 | 3 | 4 | 5 |
| Albumin with azido group introduced therein of Preparation Example 12 | 1 g | — | — | — | — |
| Albumin with sulfonylazido group introduced therein of Preparation Example 15 | — | 1 g | — | — | — |
| Albumin with cinnamoyl group introduced thereinto of Preparation Example 17 | — | — | 1 g | — | — |
| Albumin with methacryloyl group introduced thereinto of Preparation Example 18 | — | — | — | 1 g | — |
| Albumin | — | — | — | — | 1 g |
| Erythrosine B (light-sensitizer) | 0.1 g | — | 0.1 g | 0.1 g | 0.1 g |
| 4-Anisil-2,6-diphenyl-pyrylium perchlorate (1% solution in acetone) (light-sensitizer) | 10 g | — | 10 g | 10 g | 10 g |
| Water | 40 g | 50 g | 40 g | 40 g | 40 g |
| Formation of recording image | formed | formed | formed | formed | not formed |

PREPARATION EXAMPLE 20

Graft Copolymerization of Albumin by Methyl Methacrylate

To a solution of 10 g of egg albumin powder (produced by Wako Pure Chemical Industry Co., Ltd.) in 75 g of water were added 5 g of methyl methacrylate, 1 g of 6% by weight nitric acid, and 5 g of 1% by weight cerium nitrate ammonium, and graft copolymerization was performed at 30° C. for 40 minutes while introducing nitrogen gas into the reactor. The polymerization was then stopped by adding a small amount of ethanol and, thereafter, monomers, nitric acid, etc., remaining in the reaction solution were removed by dialyzing with flowing water for 72 hours. Then, a ultrasonic wave treatment was applied to dissolve insoluble materials contained in the reaction solution, and the residue was filtered off to obtain an aqueous solution. The solid content of the aqueous solution was 6.6%.

PREPARATION EXAMPLE 21

Graft Copolymerization of Albumin by Acrylonitrile

To a solution of 10 g of egg albumin in 145 g of water were added 5 g of acrylonitrile, 1 g of 6% by weight nitric acid, and 5 g of 1% by weight cerium nitrate ammonium, and graft copolymerization was performed at 30° C. for 40 minutes in the atmosphere of nitrogen. After the reaction solution was dialyzed with flowing water for 48 hours, ethanol was added thereto to precipitate a reaction product, and the reaction product was purified to obtain 8.2 g of a solid material.

PREPARATION EXAMPLE 22

Graft Copolymerization of Albumin by Methyl Methacrylate

To a solution of 2 g of egg albumin in 330 g of water were added 40 g of methyl methacrylate, 4 g of 6% by weight nitric acid, and 19 g of 1% by weight cerium nitrate ammonium, and graft copolymerization was performed at 30° C. for 20 minutes in the atmosphere of nitrogen. After the reaction solution was dialyzed with flowing water for 48 hours, ethanol was added to precipitate a reaction product, and the reaction product was purified to obtain 4.8 g of a solid material. This solid material was extracted with acetone for 72 hours in a Soxlet extractor to remove homopolymers easily soluble in acetone which were contained in the solid material and to obtain 4.6 g of a graft copolymer. This graft copolymer was insoluble in water and was soluble in polar solvents, such as dimethylformamide and γ-butyrolactone.

The following Examples 1 and 2 illustrate embodiments of the invention employing a chemically modified thermally coagulatable proteinaceous compound containing therein no intermolecular cross-linking bond.

EXAMPLE 1

Each solution having the formulation as indicated in Table 2 was subjected to a ultrasonic wave treatment to disperse carbon black therein. The ultrasonic wave treatment was carried out by immersing an ultrasonic wave horn (out put power: 150 W, area: about 1 cm$^2$) with water to which the proteinaceous compound had been added and applying thereto the ultrasonic wave for about 2 minutes. It was then coated on a 100 μm thick polyester film by the use of a wire bar and dried at 40° C. to form a black recording layer having an optical density of 2.5. The thus-obtained recording layer was exposed to light through a lith film original having a 150 line half tone pattern, superposed on the recording layer, by the use of a xenon flash light source and then developed by applying thereon a shower water having a pressure of 2.0 kg/cm$^2$. With each recording layer, the irradiation energy required for obtaining a 50% dot image from the 50% half tone pattern was measured, and its specific sensitivity was determined with the sensitivity of Run No. 15 (control) as 100. The results are shown in Table 2.

TABLE 2

| | Run No. | | | | | | | | | | | | | | |
|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 (control) |
| Chemically modified albumin solution of Preparation Example 1 (g) | 108 | — | — | — | — | — | 108 | — | — | — | — | — | — | — | — |
| Chemically modified Albumin solution of Preparation Example 2 (g) | — | 172 | — | — | — | — | — | — | — | — | — | — | — | — | — |
| Chemically modified albumin solution of Preparation Example 3 (g) | — | — | 124 | — | — | — | — | — | — | — | — | — | — | — | — |
| Chemically modified albumin solution of Preparation Example 4 (g) | — | — | — | 130 | — | — | — | — | — | — | — | — | — | — | — |
| Chemically modified albumin solution of Preparation Example 5 (g) | — | — | — | — | 172 | — | — | — | 22.2 | — | 22.2 | — | — | — | — |
| Chemically modified albumin solution acetylated by acetic anhydride (g) | — | — | — | — | — | 162 | — | — | — | — | — | — | — | — | — |
| Chemically modified albumin solution of Preparation Example 10 (g) | — | — | — | — | — | — | — | 79 | — | — | — | — | — | — | — |
| Chemically modified albumin solution of Preparation Example 11 (g) | — | — | — | — | — | — | — | — | 133 | — | — | — | — | — | — |
| Chemically modified albumin solution of Preparation Example 12 (g) | — | — | — | — | — | — | — | — | — | 3.3 | 3.9 | 3.9 | 4.7 | 4.7 | — |
| Chemically modified albumin solution by 3,5-dinitrobenzoyl chloride (g) | — | — | — | — | — | — | — | — | — | — | 0.8 | — | — | — | — |
| Albumin (g) | — | — | — | — | — | — | — | 3.1 | — | 1.7 | 1.7 | 1.7 | 1.7 | 1.7 | 6.3 |
| Carbon black (g) (light-heat conversion substance) | 3 | 3 | 3 | 3 | 3 | 3 | 3 | 3 | 3 | 3 | 3 | 3 | 3 | 3 | 3 |
| Urea (g) (heat sensitizer) | — | — | — | — | — | — | 1.3 | — | — | — | — | 1.3 | — | — | — |
| Erythrosine B (g) (light sensitizer) | — | — | — | — | — | — | — | — | — | — | — | — | — | 0.6 | — |
| 2,4,6-Triphenylpyrylium perchlorate (g) (1% solution in acetone) (light sensitizer) | — | — | — | — | — | — | — | — | — | — | — | — | — | 6.3 | — |
| Water | 64 | — | 48 | 42 | — | 10 | 64 | 90 | 39 | 144 | 165 | 143 | 165 | 159 | 166 |
| Specific Sensitivity | 120 | 115 | 105 | 105 | 110 | 105 | 133 | 150 | 165 | 130 | 135 | 150 | 120 | 132 | 100 |

EXAMPLE 2

To each of the chemically modified albumin solutions obtained in Preparation Examples 6, 7, 8 and 9, a chemically modified product of albumin by sodium cyanate, a methylated albumin (produced by Calbiochem-Behring Corp.), an amidation product of albumin by water-soluble carbodiimide, a chemically modified product of albumin by 4-nitrophenylsulphenyl chloride, a chemically modified product of albumin by p-toluenesulfonyl chloride, a hydrolysis product of soybean protein by an acid, a hydrolysis product of soybean protein by an alkali, a polytyrosylated albumin, a polylysynated albumin, and a chemically modified product of albumin by acrylonitrile was added water to prepare an aqueous solution having a solid content of 3.3%.

To 180 g of the aqueous solution was added 3 g of carbon black, and the resulting mixture was then subjected to a ultrasonic wave treatment to disperse the carbon black in the water. The thus-obtained dispersion was coated on a polyester film by the use of a wire bar and then dried at 40° C. to form a black recording layer.

The black recording layer thus-obtained was exposed to light through a lith film negative original superposed thereon, by the use of a xenon flash light source, and on spraying water on the above imagewise exposed recording layer, a sharp black positive image was obtained.

The following Example 3 illustrates an embodiment of the invention employing a light-sensitive chemically modified proteinaceous compound containing therein no intermolecular cross-linking bond.

EXAMPLE 3

| Protein with Light-Sensitive Group Introduced thereinto | 1 g |
|---|---|
| Albumin | 0.3 g |
| Urea | 0.3 g |
| Carbon Black | 1 g |
| Water | 40 g |

Using each of the albumin with the azido group introduced thereinto which was prepared in Preparation Examples 13 and 14, the albumin with the sulfonylazido group introduced thereinto which was prepared in Preparation Examples 15 and 16, the albumin with the cinnamoyl group introduced thereinto which was prepared in Preparation Example 17, the albumin with the methacryloyl group introduced thereinto which was prepared in Preparation Example 18, and the globulin with the azido group introduced thereinto which was prepared in Preparation Example 19, a solution having the above formulation was prepared. In order to disperse the carbon black, the solution was subjected to a ultrasonic wave treatment.

The thus-obtained dispersion was coated on a polyester film to form thereon a recording layer having an optical density of 4.0. On the recording layer was applied light having an energy quantity of 1.9 J/cm$^2$, through a lith film original having a half tone pattern with 150 lines per inch which was placed on the recording layer, by the use of a xenon flash light source. Thereafter, on spraying thereon a shower having a hydraulic pressure of 20 kg/cm$^2$, a black negative image appeared at the exposed areas.

The following Examples 4 to 6 illustrate embodiments of the invention employing a graft copolymerized proteinaceous compound containing therein no intermolecular cross-linking bond.

EXAMPLE 4

To 15 g of the graft copolymerization reaction solution of albumin and methyl methacrylate, obtained in Preparation Example 20, were added 10 g of water and 1 g of carbon black (No. 999, produced by Columbia Carbon Co.), and the resulting mixture was subjected to a ultrasonic wave treatment to obtain a dispersion. The thus-obtained dispersion was coated on a 100 μm thick polyester film by the use of a wire bar and then dried with an about 40° C. hot air to form a 1 μm thick recording layer.

A lith film original having a 110 line half tone pattern was placed on the above-prepared recording layer, and flash exposure was applied on the recording layer from the side of the original by the use of a xenon flash light source (Riso Xenofax FX-150, produced by Riso Kagaku Kogyo Co., Ltd.). Thereafter, the recording layer was washed with flowing water to remove the areas corresponding to the opaque areas of the original, leaving the areas corresponding to the transparent areas of the original, and thus a black relief image having an optical density of 3.0 was obtained.

In the above flash exposure, the optimum irradiation energy quantity for forming a sharp image on the recording layer was 1.3 J/cm$^2$, and it can thus be seen that the present recording layer can be recorded by the use of a lesser quantity of energy than that for a recording layer wherein albumin is used as a heat-sensitive component (see Comparative Example).

EXAMPLE 5

A mixture of 0.5 g of a graft copolymerization product of albumin and acrylonitrile, obtained in Preparation Example 21, and 0.5 g of egg albumin was dissolved in 25 g of water, and 0.7 g of carbon black was then added thereto. The resulting mixture was subjected to a ultrasonic wave treatment to obtain a dispersion.

The thus-obtained dispersion was coated on a polyester film and dried to form a 1 μm thick recording layer. The recording layer was flash-exposed and developed by washing with water in the same manner as in Example 4 to obtain a black image.

EXAMPLE 6

In 50 g of dimethylformamide was dissolved 2 g of the graft copolymerization product of albumin and methyl methacrylate, obtained in Preparation Example 22, and 2 g of carbon black was added thereto. The resulting mixture was then subjected to a ultrasonic wave treatment to obtain a dispersion. The thus-obtained dispersion was coated on a polyester film by the use of a wire bar and then dried to form a 1 μm thick recording layer.

The thus-obtained recording layer was flash-exposed at an irradiation energy quantity of 1.9 J/cm$^2$ in the same manner as in Example 2, and then dipped in γ-butyrolactone for 30 seconds. On rubbing the recording layer with cotton, a sharp black image was obtained.

With the images obtained in the present Example and Comparative Example, the adhesion of the image to the support was tested by the use of a cellophane tape. The results showed that the image of the present Example had better adhesion properties than that of the Comparative Example.

COMPARATIVE EXAMPLE

In 24 g of water was dissolved 1 g of egg albumin, and 1 g of carbon black was added thereto. The resulting mixture was subjected to a ultrasonic wave treatment to prepare a dispersion. The thus-obtained dispersion was coated on a 100 μm thick polyester film by the use of a wire bar and then dried with about 40° C. hot air to form a 1 μm thick recording layer.

The thus-obtained recording layer was flash-exposed and developed by washing with water in the same manner as in Example 2 to obtain a black image having an optical density of 3.0. In the above flash exposure, the optimum irradiation energy quantity required for forming a sharp image on the recording layer was 1.9 J/cm$^2$.

This comparative recording medium and the recording media obtained in Examples 4 to 6 were subjected to bending testing, with the result that the recording media obtained in Examples 4 to 6 were better than the present comparative recording medium. The bending test was carried out by evaluating whether or not the recording layer cracked upon bending the test sample (width: 2 cm, length: 5 cm) along a metal brick having an angle of 90°.

The present comparative recording medium and the recording media obtained in Examples 4 to 6 were flash-exposed at an irradiation energy quantity of 2.6 J/cm$^2$ by the use of a xenon flash light source (Riso Xenofax FX-150, produced by Riso Kagaku Kogyo Co., Ltd.).

The recording layer of the comparative recording medium suffered from burning loss, whereas no burning out was observed on the recording layer of the recording media obtained in Examples 4 to 6.

While the invention has been described in detail and with reference to specific embodiments thereof, it will be apparent to one skilled in the art that various changes and modifications can be made therein without departing from the spirit and scope thereof.

What is claimed is:

1. A thermally-sensitive recording medium comprising a recording layer provided on a support, said recording layer containing at least one chemically modified thermally coagulatable proteinaceous compound containing therein no intermolecular cross-linking bond.

2. A recording medium as in claim 1, wherein the chemically modified thermally coagulatable proteinaceous compound is light-insensitive.

3. A recording medium as in claim 1, wherein the chemically modified thermally coagulatable proteinaceous compound is light-sensitive.

4. A recording medium as in claim 2, wherein the chemically modified thermally coagulatable proteinaceous compound is a graft polymer.

5. A recording medium as in claim 1, wherein the recording layer contains a heat sensitizer.

6. A recording medium as in claim 1, wherein the recording layer contains a light sensitizer.

7. A recording medium as in claim 1, wherein the recording layer contains a light-sensitive chemically modified thermally coagulatable proteinaceous compound containing therein no intermolecular cross-linking bond, and a light-sensitive chemically unmodified thermally coagulatable proteinaceous compound containing therein no intermolecular cross-linking bond.

8. A recording medium as in claim 1, 2, 3, 4, 5, or 7, wherein the chemically modified thermally coagulatable proteinaceous compound containing therein no intermolecular cross-linking bond is present in an amount of at least about 2% by weight, based on the weight of the recording layer.

9. A recording medium as in claim 6, wherein the chemically modified thermally coagulatable proteinaceous compound containing therein no intermolecular cross-linking bond is present in an amount of at least about 2% by weight, based on the weight of the recording layer.

10. A recording medium as in claim 1, 2, 3, 4, 5, or 7, wherein the chemically modified thermally coagulatable proteinaceous compound containing therein no intermolecular cross-linking bond is present in an amount of at least about 10% by weight, based on the weight of the recording layer.

11. A recording medium as in claim 6, wherein the chemically modified thermally coagulatable proteinaceous compound containing therein no intermolecular cross-linking bond is present in an amount of at least about 10% by weight, based on the weight of the recording layer.

* * * * *